United States Patent
Sudo et al.

(10) Patent No.: US 7,345,887 B2
(45) Date of Patent: Mar. 18, 2008

(54) FLEXIBLE PRINTED BOARD MOUNTING STRUCTURE AND OPTICAL PICK UP HAVING THE SAME

(75) Inventors: Kazuya Sudo, Daito (JP); Takayuki Murakami, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 265 days.

(21) Appl. No.: 11/116,428

(22) Filed: Apr. 28, 2005

(65) Prior Publication Data

US 2005/0266704 A1 Dec. 1, 2005

(30) Foreign Application Priority Data

Apr. 28, 2004 (JP) .............................. 2004-132702

(51) Int. Cl.
*H05K 1/00* (2006.01)
(52) U.S. Cl. ..................... 361/749; 174/254; 385/92
(58) Field of Classification Search .................. 385/92; 174/254; 439/67
See application file for complete search history.

(56) References Cited

U.S. PATENT DOCUMENTS

2002/0021631 A1* 2/2002 Yokohama et al. ...... 369/44.16
2003/0075355 A1* 4/2003 Anderson et al. ........... 174/254
2004/0067030 A1* 4/2004 Rathnam et al. .............. 385/92

FOREIGN PATENT DOCUMENTS

JP 07-263836 A 10/1995

* cited by examiner

*Primary Examiner*—Tuan T. Dinh
*Assistant Examiner*—Andargie Aychillhum
(74) *Attorney, Agent, or Firm*—Global IP Counselors, LLP

(57) ABSTRACT

A flexible printed board mounting structure includes a main body that has an attachment portion on its rear side surface, and a flexible printed board that is attached to the rear side surface and the attachment portion of the main body. The surface of the attachment portion is substantially perpendicular to the rear side surface. The flexible printed board includes a first area that is at least partially attached to the rear side surface of the main body, an attachment area to which a light-receiving IC is attached, the attachment area being attached to the attachment portion of the main body, and a connecting portion that is unitarily formed with the first area and the attachment area and connects the first area and the attachment area in a deflective manner. The position of the light-receiving IC can be easily adjusted relative to the attachment portion of the main body.

15 Claims, 4 Drawing Sheets

FLEXIBLE PRINTED BOARD MOUNTING STRUCTURE AND OPTICAL PICK UP HAVING THE SAME

BACKGROUND OF THE INVENTION

1. Field of the Invention

The present invention relates to a structure for mounting a flexible printed board and an optical pick up having the flexible printed board mounting structure. More specifically, the present invention relates to a structure in which a light-receiving IC is mounted on a flexible printed board is installed on the main body of an optical pickup.

2. Background Information

Driving devices for optical disks generally include an optical pick up. Such optical pick up generally includes a bi-axial actuator and a slide base that houses the bi-axial actuator. The slide base has an objective lens through which light from a light source such as a semiconductor laser is collected on the optical disk. Photodiode is an example of the known light source. The bi-axial actuator shifts the objective lens in two directions (focus direction and tracking direction) to focus the light on the surface of the optical disk.

An example of the flexible printed board in accordance with the conventional art is shown in FIGS. 7 and 8. The flexible printed board 160 of this conventional art is to be attached to a sliding base 122, which has a mounting hole 140 for mounting a photodiode PD on the side surface 131. The mounting hole 140 has a vertically symmetrical shape relative to a horizontal line. A positioning hole 142 is formed on the sliding base 122 so as to be connected with the mounting hole 140. This positioning hole 142 is adapted to fit over the lens 144 of the photodiode PD. The lens 144 has a substantially hemispherical shape. Two grooves 146, 146 are formed in the mounting hole 140, on which an adhesive B is to be applied. An adhesive surface 162 of the flexible printed board 160 is attached to the peripheral surface 150 around the mounting hole 140 and to the bottom surface 132 of the sliding base 122. An example of such structure is disclosed in, for example, Japanese Patent Application Publication No. 7-263836.

In this structure, as shown in FIGS. 7-8, the photodiode PD is positioned at the attachment place (the mounting hole 140 and the positioning hole 142) by bending the flexible printed board 160 at a border 163 by about 180 degrees. Here, the distance LC between the border 163 and the upper edge of the photodiode PD is substantially the same as the distance LE between the upper edge of the side surface of the sliding base 122 and the upper edge of the mounting hole 140. In other words, the photodiode PD of the flexible printed board 160 is disposed in the attachment place by tightly attaching the bent portion of the flexible printed board 160 to the side surface of the sliding base 122. (ADDED btw 0002-0003)

Such structure, however, requires high precision in manufacturing and positioning of the components. Accordingly, it has been a problem that the mounting position of the lens 144 of the photodiode PD tends to be misaligned.

In view of the above, it will be apparent to those skilled in the art from this disclosure that there exists a need for improved flexible printing board mounting structure and optical pick up that overcome the problems of the conventional art. This invention addresses this need in the art as well as other needs, which will become apparent to those skilled in the art from this disclosure.

SUMMARY OF THE INVENTION

It is an object of the present invention to provide a flexible printed board mounting structure and an optical pick up in which the position of the flexible printed board can be easily adjusted relative to the attachment portion of the main body.

A flexible printed board mounting structure in accordance with the first aspect of the present invention includes a main body and a flexible printed board attached to at least the rear side surface and the attachment portion of the main body. The main body has a front side surface, a rear side surface, and an attachment portion that is on the rear side surface. A surface of the attachment portion is substantially perpendicular to the rear side surface. The flexible printed board includes a first area that is at least partially attached to the rear side surface of the main body, an attachment area to which a light-receiving IC is attached, the attachment area being attached to the attachment portion of the main body, and a connecting portion that is unitarily formed with the first area and the attachment area and connects the first area and the attachment area in a deflective manner.

With this structure, since the connecting portion loosely connects the first area and the attachment area in a deflective manner, it is possible to make adjustments in the position of the attachment area relative to the attachment portion of the main body.

The flexible printed board mounting structure in accordance with the second aspect of the present invention is the flexible printed board mounting structure in accordance with the first aspect of the present invention, in which the flexible printed board further includes a second area that is folded to face the first area, and an interlocking portion formed unitarily with the second area. The first area has an interlocking hole formed thereon. The interlocking portion interlocks with the interlocking hole.

With this structure, due to the interlocking portion that interlocks with the interlocking hole, the first and second areas are folded with a clearance therebetween. Accordingly, the position of the attachment area of the flexible printed board relative to the attachment portion of the main body can be adjusted even more easily.

The flexible printed board mounting structure in accordance with the third aspect of the present invention is the flexible printed board mounting structure in accordance with the first aspect of the present invention, in which the interlocking portion is substantially arrow-shaped.

Since the interlocking portion is arrow-shaped, the interlocking portion can be easily inserted into and remain interlocked with the interlocking hole.

The flexible printed board mounting structure in accordance with the fourth aspect of the present invention is the flexible printed board mounting structure in accordance with the second aspect of the present invention, in which the interlocking hole is an elongated hole that extends in a first direction, and the interlocking portion has a portion that extends in a second direction, the second direction intersecting with the first direction.

With the above structure, interlocking portion can be easily inserted into the interlocking hole by twisting the interlocking portion. The interlocking portion can then remain interlocked with the interlocking hole stably.

The flexible printed board mounting structure in accordance with the fifth aspect of the present invention is the flexible printed board mounting structure in accordance with the fourth aspect of the present invention, in which the interlocking portion is substantially cross-shaped.

The flexible printed board mounting structure in accordance with the sixth aspect of the present invention is the flexible printed board mounting structure in accordance with the second aspect of the present invention, in which the interlocking hole is a L-shaped slot that opens to an edge of the first area.

With the structure, the interlocking portion is easily inserted into an interlocking hole which is a substantially L-shaped slot from the opening of the slot, and the interlocking portion can remain interlocked with the bent portion of the interlocking hole.

The flexible printed board mounting structure in accordance with the seventh aspect of the present invention is the flexible printed board mounting structure in accordance with the sixth aspect of the present invention, in which the interlocking portion is substantially T-shaped.

The flexible printed board mounting structure in accordance with the eighth aspect of the present invention is the flexible printed board mounting structure in accordance with the first aspect of the present invention, in which the connecting portion connects the first area with an end of the attachment area that is farther from the rear side surface of the main body.

The flexible printed board mounting structure in accordance with the ninth aspect of the present invention is the flexible printed board mounting structure in accordance with the second aspect of the present invention, in which the first area is attached to the rear side surface of the main body via a first side of the second area, and the light-receiving IC is attached to the first side of the attachment area.

An optical pick up in accordance with the tenth aspect of the present invention includes an objective lens; a main body; and a flexible printed board. The main body has a front side surface on which the objective lens is provided, a rear side surface, and an attachment portion that is on the rear side surface. A surface of the attachment portion is substantially perpendicular to the front and rear side surfaces. The flexible printed board is attached to at least the rear side surface and the attachment portion of the main body. The flexible printed board has a first area, a second area that is folded to face the first area, an attachment area to which the first side of which a light-receiving IC is attached, a connecting portion, and an interlocking portion formed unitarily with the second area. The first area has an interlocking hole formed thereon. The first area is at least partially attached to the rear side surface of the main body via a first side of the second area. The attachment area is attached to the attachment portion of the main body. The connecting portion is unitarily formed with the first area and the attachment area and connects in a deflective manner the first area and an end of the attachment area that is farther from the rear side surface of the main body. The interlocking portion interlocks with the interlocking hole.

The optical pick up in accordance with the eleventh aspect of the present invention is the optical pick up in accordance with the tenth aspect of the present invention, in which the interlocking portion is substantially arrow-shaped.

The optical pick up in accordance with the twelfth aspect of the present invention is the optical pick up in accordance with the tenth aspect of the present invention, in which the interlocking hole is an elongated hole that extends in a first direction, and the interlocking portion has a portion that extends in a second direction, the second direction intersecting with the first direction.

The optical pick up in accordance with the thirteenth aspect of the present invention is the optical pick up in accordance with the twelfth aspect of the present invention, in which the interlocking portion is substantially cross-shaped.

The optical pick up in accordance with the fourteenth aspect of the present invention is the optical pick up in accordance with the twelfth aspect of the present invention, in which the interlocking hole is a L-shaped slot that opens to an edge of the first area.

The optical pick up in accordance with the fifteenth aspect of the present invention is the optical pick up in accordance with the twelfth aspect of the present invention, in which the interlocking portion is substantially T-shaped.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 4 shows a state in which the first area and second area of the flexible printed board shown in FIG. 3 are folded by about 180 degrees, and an interlocking portion is inserted and interlocked in an interlocking hole, wherein (a) is a schematic front view of a state in which the first area and second area are overlapping, and (b) is a schematic front view of a state in which the second area is slightly raised up from the state in (a);

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

The embodiments of the structure for mounting a flexible printed board relating to the present invention will now be described with reference to the diagrams.

Figure 1:
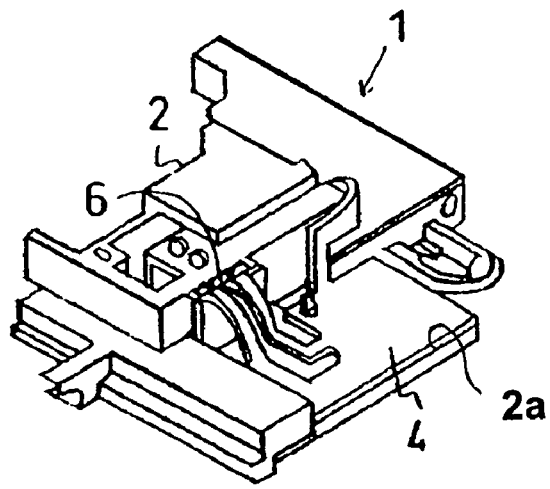
FIG. 1 is a perspective view of an optical pickup having a structure for mounting a flexible printed board of the first embodiment as seen from the back.

FIG. 1 is a perspective view of an optical pickup 1 having a flexible printed board mounting structure in accordance with the first embodiment, as seen from the reverse side.

Figure 2:
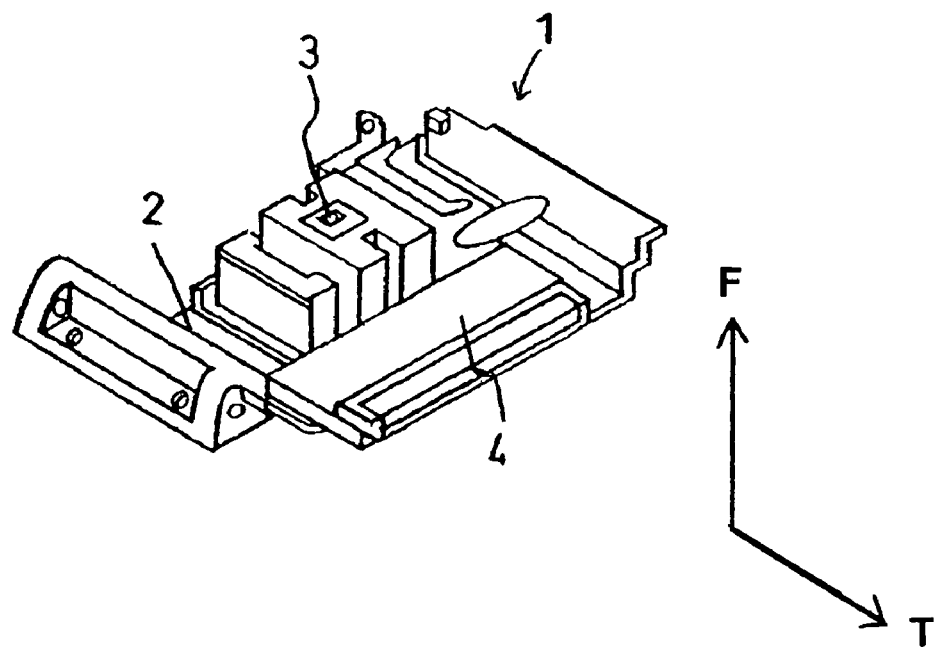
FIG. 2 is a perspective view of the optical pickup in FIG. 1 as seen from the front.
Figure 3:
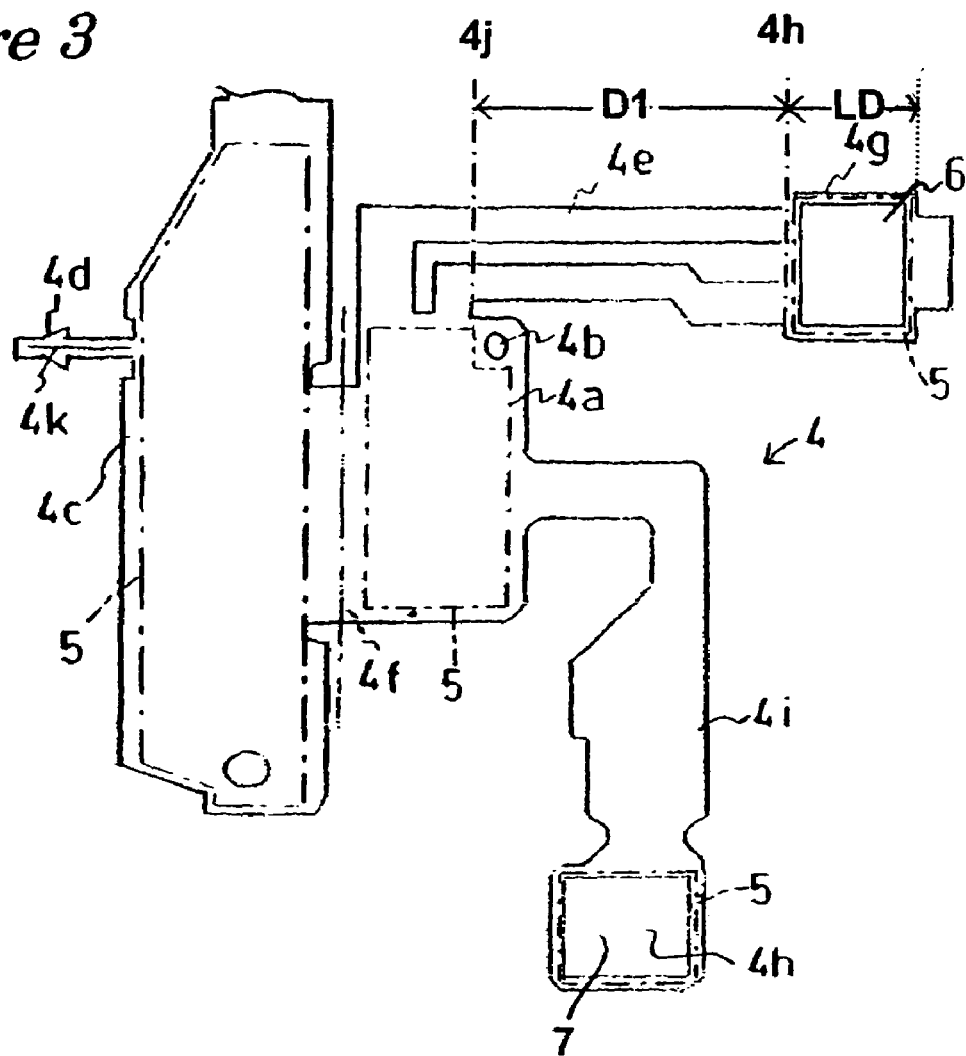
FIG. 3 is a projection of the flexible printed board in the structure for mounting a flexible printed board in the first embodiment.

FIG. 2 is a perspective view of the optical pickup shown in FIG. 1 as seen from the front side. FIG. 3 is a projection of the flexible printed board used in the flexible printed board mounting structure in accordance with the first embodiment. FIG. 4 shows the state of the flexible printed board as attached to the main body, with the first area and second area of the flexible printed board shown in FIG. 3 being folded and the interlocking portion being inserted into and interlocked with the interlocking hole. In FIG. 4(*a*), the first area and the second area are completely folded, while in FIG. 4(*b*) the second area is slightly lifted from the first area.

The optical pickup 1 has a main body 2 made of zinc, a lens 3 that is disposed in the center of the main body 2, and a flexible printed board 4, as shown in FIGS. 1 and 2. The flexible printed board 4 is attached from the reverse side to the front side of the optical pickup 1. In FIG. 2, the arrow F shows the direction of the focus control, while the arrow T shows the direction of the tracking control. As shown in FIG. 3, reinforcing plates 5 are partially bonded to the reverse side of the flexible printed board 4. As shown in FIG. 1, a PDIC (hereinafter referred to as light-receiving IC) 6 is bonded to a specific location on the flexible printed board 4 on the front side of the main body 2 of the optical pickup 1, such that the light-receiving IC 6 is mounted to a specific location (light receiving location) on the front side of the main body 2 of the optical pickup 1 with an adhesive.

As shown in FIG. 3, the flexible printed board 4 mainly includes a first area 4*a*; a second area 4*c* which is folded to face the first area 4*a* when the flexible printed board 4 is attached to the rear side surface 2*a* of the main body 2; and a narrow belt-shape part 4*e* that extends out of the side of the first area 4*a* of the flexible printed board 4. The first area 4*a* is attached to the rear side surface 2*a* of the main body 2 via the front side (an example of the first side) of the second area 4*c*. A substantially circular interlocking hole 4*b* is formed at a specific location in the first area 4*a* of the flexible printed board 4. A substantially arrow-shaped interlocking portion 4*d* is formed unitarily with and protruding from the second area 4*c*. Furthermore, the light-receiving IC 6 is mounted on the front surface (the paper surface of FIG. 3, an example of the first side) of the distal portion 4*g* (an example of the attachment area), which is formed at the distal end of the narrow belt-shaped part 4*e*. In this embodiment, the flexible printed board 4 further includes a third area 4*i*, which has a distal portion 4*h* at the end to which a second IC 7 is bonded. The interlocking portion 4*d* is internally provided with a linear reinforcing pattern 4*k*. Furthermore, in this embodiment, the reinforcing plates 5 are bonded to the rear surface (the opposite surface of the paper surface of FIG. 3) of the first area 4*a*, the second area 4*c*, and the distal portions 4*g* and 4*h*.

The first area 4*a* and the second area 4*c* of the flexible printed board 4 are bent by about 180 degrees at a border 4*f* shown in FIGS. 4(*a*) and 4(*b*), with the interlocking portion 4*d* of the second area 4*c* being inserted into and interlocked with a slight clearance into the interlocking hole 4*b* of the first area 4*a*. The narrow belt-shaped part 4*e* is bent at around a border 4*j* by about 90 degrees relative to the reinforcing plates 5. As shown in FIG. 4, the narrow belt-shaped part 4*e* is hung downward.

Then, at the end of the belt-shaped part 4*e*, the distal portion 4*g* is curvedly folded by about 180 degrees at a border 4*h*. Accordingly, the light-receiving IC 6 on the distal portion 4*g* is mounted at the light receiving location on the main body 2 of the optical pickup 1.

Here, the belt-shaped portion 4*e* is formed such that the distance D1 between the boarders 4*j* and 4*h* is longer than the sum of the length LD of the light-receiving IC 6, the thickness of the reinforcing plate 5, and the distance LE between the upper edge of the side surface of the main body 2 and the upper edge of the mounting hole 140. Accordingly, when the flexible printed board 4 is attached to the main body 2, there is formed a connecting portion 4*m* that is unitarily formed with the first area 4*a* and the distal portion 4*g* and connects the first area 4*a* and the distal portion 4*g* in a deflective manner. In this embodiment, as shown in FIG. 4, the connecting portion 4*m* connects the first area 4*a* with an end of the distal portion 4*g* that is farther from the rear side surface 2*a* of the main body 2.

Therefore, according to the first embodiment, since the flexible printed board 4 is provided with the connecting potion 4*m* that loosely connects the first area 4*a* and the distal portion 4*g* when the flexible printed board 4 is attached to the main body 2, minor adjustment of the position of the light-receiving IC 6 can be easily performed while the flexible printed board 4 is bent at the border 4*j* as well as at the border 4*h*.

Furthermore, since the distal portion 4*g* is loosely connected to the first area 4*a* via the flexed portion 4*m*, the load applied to the adhesive that attaches the light-receiving IC 6 to the attaching portion of the main body 2 can be lightened once the flexible printed board 4 is attached to the main body 2.

Furthermore, since the interlocking portion 4*d* interlocks with the interlocking hole 4*b*, the first and second areas 4*a* and 4*c* are folded with a clearance therebetween, as shown in FIG. 4(*b*). Accordingly, the position of the distal portion 4*g* of the flexible printed board 4 relative to the attachment portion of the main body 2 can be adjusted even more easily.

Still furthermore, the interlocking portion 4*d* of the second area 4*c* is formed in a substantially arrow shape. Thus, the interlocking portion 4*d* can be easily inserted into the interlocking hole 4*b* of the first area 4*a* and remain inserted. In other words, the interlocking portion 4*d* can be prevented from being inadvertently removed. The interlocking portion 4*d* can also be prevented from bending because the interlocking portion 4*d* is provided with the linear reinforcing pattern 4*k*.

ALTERNATIVE EMBODIMENTS

Figure 5:
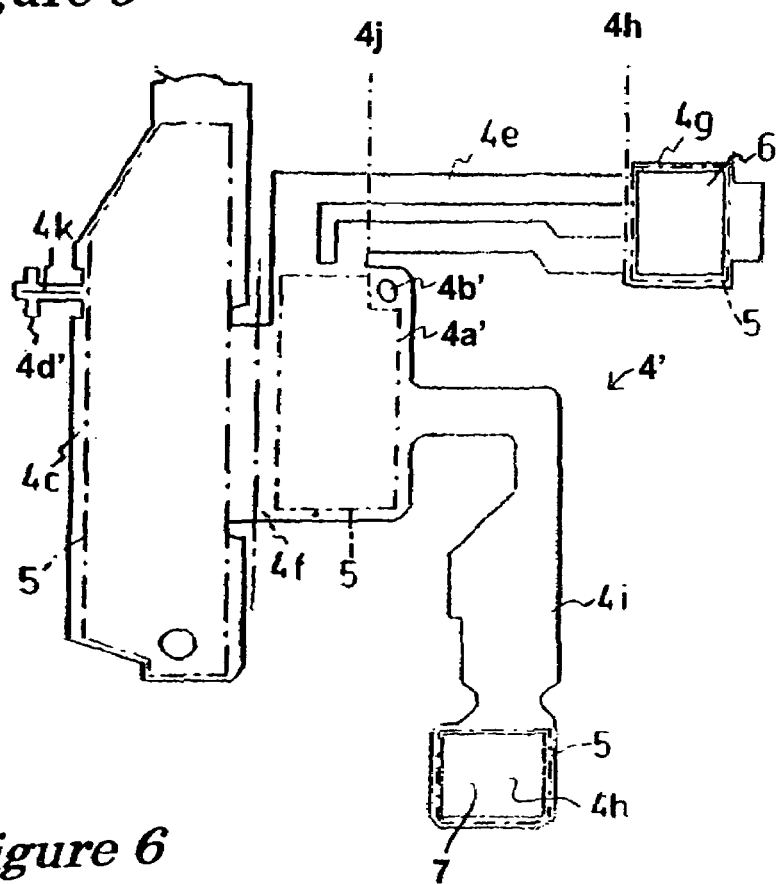
FIG. 5 is a projection of the flexible printed board in the structure for mounting a flexible printed board of the second embodiment.
Figure 6:
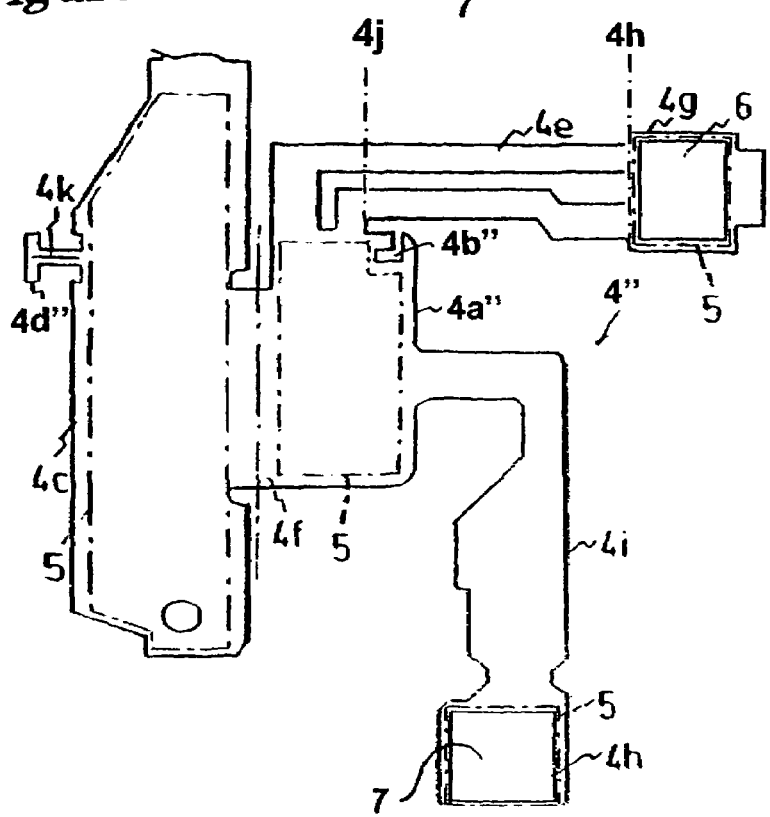
FIG. 6 is a projection of the flexible printed board in the structure for mounting a flexible printed board of the third embodiment.
Figure 7:
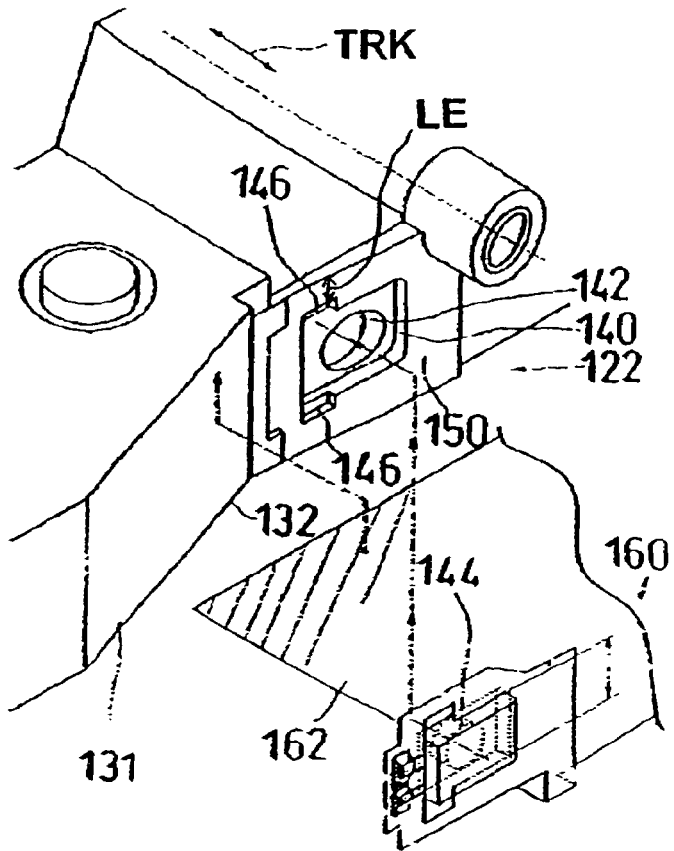
FIG. 7 is a perspective view showing a sliding base of an optical pickup, a flexible printed board, and a photodiode in a conventional printed board.
Figure 8:
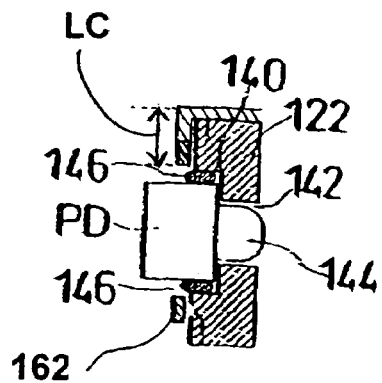
FIG. 8 is a cross-sectional view showing the sliding base, the flexible printed board, and the photodiode in the same printed board in an integrally mounted state.

Referring now to FIGS. 5-6, the flexible printed board mounting structure in accordance with alternative embodiments will now be explained. In view of the similarity between the first and alternative embodiments, the parts of the alternative embodiments that are identical to the parts of the first embodiment will be given the same reference numerals as the parts of the first embodiment. Moreover, the descriptions of the parts of the alternative embodiments that are identical to the parts of the first embodiment may be omitted for the sake of brevity. The parts of the alternative embodiments that differ from the parts of the first embodiment will be indicated with a prime (') and a double prime (").

FIG. 5 is a projection of the flexible printed board 4' for use in a flexible printed board mounting structure in accordance with the second embodiment of the present invention.

The flexible printed board 4' of the second embodiment is different from the flexible printed board 4 of the first embodiment only in that the interlocking hole 4*b*' is provided as a rectangular hole that is oriented at an angle about 180 degrees turned relative to the interlocking portion 4*d*', as shown in FIG. 5. Also, the interlocking portion 4*d* is formed in a substantially cross shape. In the second embodiment, the substantially cross-shaped interlocking portion 4d' interlocks with the rectangular interlocking hole 4b' by twisting the interlocking portion 4d'. Once the interlocking portion 4d' is interlocked with the interlocking hole 4b, and the interlocking portion 4d' is returned to its original state, whereupon the interlocking portion 4d' remains interlocked with the interlocking hole 4b' in an intersecting manner.

Therefore, according to the second embodiment, since the interlocking portion 4d' is formed in a substantial cross shape, it can be easily inserted into and interlocked with the rectangular interlocking hole 4b' and can keep the interlocked state.

FIG. 6 is a projection of the flexible printed board 4" for use in a flexible printed board mounting structure in accordance with the third embodiment.

The flexible printed board 4" is different from the flexible printed board 4 of the first embodiment only in that the interlocking hole 4b" is formed as a substantially L-shaped slot that opens to an edge of the first area 4a". The interlocking portion 4d" is formed in a substantially T shape. The interlocking portion 4d" is twisted to be inserted sideways into the interlocking hole 4b" from the base portion of the L-shaped slot. Then, the interlocking portion 4d" remains interlocked in the bent portion of the L-shaped interlocking hole 4b", with the interlocking portion 4d" being at an angle of about 90 degrees relative to the bent portion of the L-shaped interlocking hole 4b".

According to the third embodiment, the interlocking portion 4d" can be easily inserted into the substantially L-shaped interlocking hole 4b from the edge. Then, the interlocking portion 4d" remains interlocked in the bent portion of the interlocking hole 4b. Such interlocking structure can be achieved with the interlocking portion 4d", which has a simple shape.

Furthermore, the shapes of the interlocking hole and the interlocking portion are not limited to the shapes disclosed in the above-described embodiments. The interlocking hole and the interlocking portion may take other shapes as long as their shapes allow interlocking between the interlocking portion and the interlocking hole.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-132702. The entire disclosure of Japanese Patent Application No. 2004-132702 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A flexible printed board mounting structure, comprising:
    a main body having a front side surface, a rear side surface, and an attachment portion that is on the rear side surface, a surface of the attachment portion being substantially perpendicular to the rear side surface; and
    a flexible printed board attached to at least the rear side surface and the attachment portion of the main body, the flexible printed board having
        a first area that is at least partially attached to the rear side surface of the main body,
        an attachment area to which a light-receiving IC is attached, the attachment area being attached to the attachment portion of the main body, and
        a connecting portion that is unitarily formed with the first area at one side of the connecting portion and the attachment area at the other side of the connecting portion and connects the first area and the attachment area in a deflective manner, a length between the one side and the other side along the connecting portion being longer than a length of a short side of the light-receiving IC.

2. The flexible printed board mounting structure according to claim 1, wherein
    the flexible printed board further includes
        a second area that is folded to face the first area, and
        an interlocking portion formed unitarily with the second area, and
    the first area has an interlocking hole formed thereon, the interlocking portion interlocking with the interlocking hole.

3. The flexible printed board mounting structure according to claim 2, wherein
    the interlocking portion is substantially arrow-shaped.

4. The flexible printed board mounting structure according to claim 2, wherein
    the interlocking hole is an elongated hole that extends in a first direction, and
    the interlocking portion has a portion that extends in a second direction, the second direction intersecting with the first direction.

5. The flexible printed board mounting structure according to claim 2, wherein
    the interlocking hole is a L-shaped slot that opens to an edge of the first area.

6. The flexible printed board mounting structure according to claim 2, wherein
    the first area is attached to the rear side surface of the main body via a first side of the second area, and
    the light-receiving IC is attached to the first side of the attachment area.

7. The flexible printed board mounting structure according to claim 4, wherein
    the interlocking portion is substantially cross-shaped.

8. The flexible printed board mounting structure according to claim 5, wherein
the interlocking portion is substantially T-shaped.

9. A flexible printed board mounting structure, comprising:
- a main body having a front side surface, a rear side surface, and an attachment portion that is on the rear side surface, a surface of the attachment portion being substantially perpendicular to the rear side surface; and
- a flexible printed board attached to at least the rear side surface and the attachment portion of the main body, the flexible printed board having
  - a first area that is at least partially attached to the rear side surface of the main body,
  - an attachment area to which a light-receiving IC is attached, the attachment area being attached to the attachment portion of the main body, and
  - a connecting portion that is unitarily formed with the first area and the attachment area and connects the first area and the attachment area in a deflective manner, the connecting portion connecting the first area with an end of the attachment area that is farther from the rear side surface of the main body.

10. An optical pick up, comprising:
an objective lens;
- a main body having a front side surface on which the objective lens is provided, a rear side surface, and an attachment portion that is on the rear side surface, a surface of the attachment portion being substantially perpendicular to the front and rear side surfaces; and
- a flexible printed board attached to at least the rear side surface and the attachment portion of the main body, the flexible printed board having
  - a first area having an interlocking hole formed thereon,
  - a second area that is folded to face the first area, the first area being at least partially attached to the rear side surface of the main body via a first side of the second area,
  - an attachment area to which the first side of which a light-receiving IC is attached, the attachment area being attached to the attachment portion of the main body,
  - a connecting portion that is unitarily formed with the first area and the attachment area and connects in a deflective manner the first area and an end of the attachment area that is farther from the rear side surface of the main body, and
  - an interlocking portion formed unitarily with the second area, the interlocking portion interlocking with the interlocking hole.

11. The optical pick up according to claim 10, wherein the interlocking portion is substantially arrow-shaped.

12. The optical pick up according to claim 10, wherein
the interlocking hole is an elongated hole that extends in a first direction, and
the interlocking portion has a portion that extends in a second direction, the second direction intersecting with the first direction.

13. The optical pick up according to claim 10, wherein
the interlocking hole is a L-shaped slot that opens to an edge of the first area.

14. The optical pick up according to claim 12, wherein the interlocking portion is substantially cross-shaped.

15. The optical pick up according to claim 13, wherein the interlocking portion is substantially T-shaped.

* * * * *